(12) United States Patent
Luger et al.

(10) Patent No.: US 10,493,557 B2
(45) Date of Patent: Dec. 3, 2019

(54) CONVERTER CIRCUIT

(71) Applicant: Robert Bosch GmbH, Stuttgart (DE)

(72) Inventors: Ludwig Luger, Michelstadt (DE);
Michael Steinbrecher, Erbach (DE);
Oliver Trautmann, Brensbach (DE);
Reinhard Scholz, Erbach (DE)

(73) Assignee: Robert Bosch GmbH, Stuttgart (DE)

( * ) Notice: Subject to any disclaimer, the term of this patent is extended or adjusted under 35 U.S.C. 154(b) by 424 days.

(21) Appl. No.: 15/381,162

(22) Filed: Dec. 16, 2016

(65) Prior Publication Data
US 2017/0173725 A1  Jun. 22, 2017

(30) Foreign Application Priority Data

Dec. 17, 2015 (EP) ................................. 15200687

(51) Int. Cl.
| *B23K 11/24* | (2006.01) |
| *B23K 11/25* | (2006.01) |
| *H01F 38/08* | (2006.01) |
| *H01L 23/492* | (2006.01) |
| *H01L 23/538* | (2006.01) |
| *H01L 25/07* | (2006.01) |
| *H02M 7/48* | (2007.01) |
| *H01L 23/473* | (2006.01) |

(52) U.S. Cl.
CPC .......... *B23K 11/241* (2013.01); *B23K 11/257* (2013.01); *H01F 38/085* (2013.01); *H01L 23/492* (2013.01); *H01L 23/5389* (2013.01); *H01L 25/071* (2013.01); *H02M 7/4807* (2013.01); *H01L 23/473* (2013.01)

(58) Field of Classification Search
CPC ...... B23K 9/095; B23K 11/24; B23K 11/241; B23K 11/25; H01F 27/40; H01F 38/085; H02M 1/00; H02M 1/12; H02M 7/00; H02M 7/5387; H02M 7/003; H02M 7/143; H05K 7/20; H05K 7/2089
See application file for complete search history.

(56) References Cited

U.S. PATENT DOCUMENTS

| 6,087,629 A * | 7/2000 | Thamodharan ..... H02M 7/1623 219/130.51 |
| 2013/0334178 A1* | 12/2013 | Scholz .................. B23K 11/24 219/108 |
| 2014/0085955 A1* | 3/2014 | Maeda .................. H02M 7/003 363/132 |

FOREIGN PATENT DOCUMENTS

| DE | 10 2011 012 199 A1 | 8/2012 |
| EP | 1 921 908 B1 | 5/2008 |

(Continued)

OTHER PUBLICATIONS

European Patent Office Search Report corresponding to EP Application No. 15200687.0, dated Jun. 1, 2016 (German language document) (9 pages).

*Primary Examiner* — Brian W Jennison
(74) *Attorney, Agent, or Firm* — Maginot, Moore & Beck LLP

(57) ABSTRACT

The disclosure relates to a power component for providing an electric current, having plates aligned parallel to one another which are connected to the current inputs and the current outputs of power semiconductors embedded in a component carrier. High currents, for example for resistance welding, can thereby be controlled without excessive heat losses resulting in an increase in temperature of the entire arrangement and thereby in a reduction of the service life.

17 Claims, 2 Drawing Sheets

(56) References Cited

FOREIGN PATENT DOCUMENTS

EP          2 101 402 A2    9/2009
EP          2 717 460 A1    4/2014

* cited by examiner

CONVERTER CIRCUIT

This application claims priority under 35 U.S.C. § 119 to EP application no. 15200687.0, filed on Dec. 17, 2015 in Europe, the disclosure of which is incorporated herein by reference in its entirety.

BACKGROUND

The present disclosure relates to a converter circuit for providing a high-voltage electric current, in particular an electric current such as that required in industrial processes or in powerful machines.

EP 1 921 908 B1 discloses an arrangement for providing a high-voltage electric current. FIG. 1 shows schematically in a side view here how difficult it is to dissipate the heat losses which occur in such arrangements. In more complex circuits, in which a plurality of power semiconductors are used, the costs increase accordingly. In addition to the material costs, the costs of assembly, maintenance and repair must also be taken into account here.

An additional disadvantage of the arrangement shown here is that the heat dissipation, as seen from the power module, only takes place downwards. Moreover, the total height of the arrangement is not designed favorably for heat removal since the greater the layer thickness, the more difficult it is for the heat to dissipate from the power module. All in all, the arrangement shown is therefore not recommended especially when high currents are used. The use of pressure contact means is likewise disadvantageous since these call for very high mechanical clamping forces during the assembly of the arrangement, which calls for corresponding costly mechanical devices in the area surrounding the arrangement and requires installation space. An arrangement which, with a comparable power, is of an altogether more compact construction, does not require external clamping devices and is suitable for high-voltage currents would be desirable.

SUMMARY

According to the disclosure, a converter circuit arrangement is proposed. Advantageous developments are the subject matter of the embodiments and the description below.

The converter circuit arrangement is designed for a high-voltage electric current. A high-voltage electric current refers to a current such as that occurring for example in resistance welding, for driving servomotors, for driving powerful machines or when driving electric vehicles. It generally relates to currents in the single-digit or multi-digit kiloampere range, preferably of three-phase systems. It particularly concerns applications in which the circuit, starting from a DC link voltage, is supplied by an inverter. The arrangement serves in particular for industrial resistance welding in which currents of up to, for example, 20 kA or higher can occur.

The first and second controllable switching means refer preferably to power semiconductors. Each power semiconductor comprises at least one current input, a current output and a control connection. It can refer for example to metal oxide field effect transistors and the like, or also to IGBTs.

To receive the power semiconductors, a component carrier having conductor paths is provided. The component carrier is an electrically insulating material having conductive connections. As an insulating material, it is possible to use fiber-reinforced plastics material, in particular also flexible materials, in particular also film-like materials. The power semiconductors are completely or partially embedded in the component carrier; the power semiconductors are preferably surrounded on all sides or in sections by the material of the component carrier. In the case of particularly preferred complete embedding of the power semiconductors in the component carrier, these are no longer visible because they are located in the interior of the component carrier and are connected there to at least one conductor path plane.

The power semiconductors are interconnected with one another by means of the conductor paths to realize a converter circuit. The converter circuit can be realized for example as a center point circuit, a bridge circuit or a bidirectional circuit. It is preferably provided for inversion or rectification or conversion. The converter circuit is preferably provided for rectifying an alternating current into a direct current.

As a result of the design according to the disclosure, it was possible to significantly reduce the power loss arising during operation of the converter.

As a result of the design according to the disclosure, a compact converter is achieved, which can be easily integrated in a housing and thereby easily mounted or replaced in the field. The housing is preferably realized in the manner of a disk cell in which the converter is completely integrated. Disk cells of this type are easy to handle, store or install. However, the housing can also be given any other form—appropriate to the specific application—it is preferably constructed in a flat design and provided with a circular or rectangular form.

By embedding the power semiconductors and/or the conductor paths in the component carrier, the thermal deformations of the components and/or the component carrier which arise during operation as a result of the thermal losses could be compensated and reduced. The mechanical loads to which the entire arrangement is exposed during operation are correspondingly lower. A semiconductor with a separate housing, preferably with a CAN housing, is preferably used as a power semiconductor.

The converter according to the disclosure can therefore be arranged in its place of use with fewer costly mechanical structures for clamping or locking the converter in place and replaces converter circuits based on individual components, such as for example rectifier diodes, which are generally linked to a high power loss and whereof the assembly is costly as a result of the necessary complicated mechanical pressure contact technology and requires a lot of space.

The component carrier preferably comprises a plurality of component carrier planes or conductor path planes arranged above one another. To this end, the component carrier can be of a multi-layer construction, i.e. it can comprise a plurality of conductor path planes which can be connected to one another by pressure contact means. The current inputs are preferably connected to a first plane and the current outputs are preferably connected to a second plane. The control inputs can be connected to a third plane, with the third plane preferably being arranged between the first and the second plane. Each control input can also be connected to a separate conductor path plane, which are preferably arranged between the first and the second plane. In principle, however, other connections can also be realizable. Therefore, the control inputs, for example, can be connected to a first or second plane and the current inputs/current outputs or power semiconductor connections can be connected to the other planes in each case. It is also possible to provide more or fewer than three planes.

The material thickness of the component carrier is designed in such a way that it has the lowest possible thermal resistance, still with adequate stability. As a result, the component carrier also becomes easily mechanically flexible, stores barely any heat and can compensate mechanical stresses which arise as a result of heat development.

The control connections are advantageously arranged in such a way that, for actuating the control connections on the component carrier, control lines for the power semiconductors are substantially similar or symmetrical to one another. This applies in particular at least in relation to the conductor path routing, the conductor path dimensions and the conductor path forms. For optimum adaptation, for example of a welding current, to a specific welding task, it is possible to program a current increase at the start of the welding procedure or also a current decrease at the end of the welding task. To this end, rapid switching of the current is required so that the welding current pulses can be converted preferably as specified. By means of the proposal according to the disclosure in relation to the control lines, rapid switching of the power semiconductors can be ensured by means of the optimized conductor path routing.

The converter preferably comprises means for the input-side connection of the converter circuit to transformer windings and for the output-side connection of the converter circuit to a load. The converter can thereby be easily integrated, for example, in an existing application, such as, for example, a resistance welding application.

The converter circuit is preferably realized as a center point circuit. Therefore, on the output side, a load can also be connected to the center tap of a transformer winding on the secondary side. Then only two power semiconductors are required.

An actuating device for actuating the power semiconductors is particularly preferably at least partially embedded in the component carrier or arranged on the component carrier and connected to the control connections by means of the conductor paths and arranged in particular between the current conducting plates (mechanical protection). The actuating device generates actuating pulses by means of which the power semiconductors may be through-connected. The actuating device can also assume even more complex tasks, such as, for example, monitoring the status of the converter. A data interface (e.g. field bus interface or wireless interface) is preferably comprised by the component carrier; it is additionally possible for the actuating device to be able to communicate with a superordinate device and receive instructions for the actuation. In resistance welding, for example, welding takes place by means of pulses. To realize a pre-heating time or post-heating time with a corresponding current value and to realize the welding pulses, for example, the actuating device could thereby assume the actuation of the power semiconductors autonomously or by interacting with a superordinate welding control. For optimum adaptation, for example, of a welding current to a specific welding task, it is possible to program a current increase at the start of the welding procedure or also a current decrease at the end of the welding task. The total welding time can thereby be repeated several times by the actuating device by inputting the number of pulses.

The component carrier is preferably arranged between at least one electrically conductive current input plate (first or second current conducting plate) and at least one electrically conductive current outlet plate (second or first current conducting plate) and aligned substantially parallel to both current conducting plates. The current inputs of both power semiconductors are preferably electrically conductively connected to the current input plate, and the current outputs of both power semiconductors are preferably electrically conductively connected to the current outlet plate. Preferably, either the current inputs of both power semiconductors are electrically conductively connected to a common or separate current input plate in each case and/or the current outputs of both power semiconductors are electrically conductively connected to a common or separate current outlet plate in each case. As a result, the above-mentioned disk cell housing, or a flat housing which is very similar thereto, can be easily realized.

An advantage of the arrangement is that heat dissipation and, at the same time, current conduction is realized by means of both current conducting plates. The current input plate and current outlet plate therefore fulfill a double function, namely, on the one hand, the current supply and current discharge to/from the power semiconductor and, as a result of the arrangement in sandwich form, at the same time also the cooling of the semiconductor on the current input side and/or on the current output side. The arrangement, which is optimized in terms of the total height, requires short paths for current and heat. This results in low losses within the arrangement itself and rapid heat removal. Drops in temperature in the material barely occur.

The inventive construction of the arrangement is preferably a cast construction, which also ensures a mechanical cohesion of the components and therefore does not require any pressure contact means. The disadvantages linked to pressure contact means would thereby be overcome. Current inputs and/or current outputs arranged opposite one another simplify the installation of the power component according to the disclosure in corresponding component holders, such as those used for example for disk cells. It is possible to use copper or molybdenum, for example, as plate material. The above-mentioned connections between power semiconductor and plates can be realized by soldering and/or sintering and/or by means of mechanical connecting elements.

It is proposed to provide suitable means on at least one current conducting plate so that heat from the current conducting plate may be easily dissipated. This may be realized for example by means of a current conducting plate having integrated cooling channels for realizing water cooling during the operation of the arrangement. However, it would also be possible to use additional separate cooling plates to the current conducting plates, which have cooling channels and preferably lie against the current input plate and/or the current outlet plate. These additional cooling plates could also be an integral part of a holder for the converter circuit arrangement, wherein the arrangement may be clamped between both cooling plates so as to ensure an optimum heat transfer and current transmission between all plates and the connections of the holder.

The plates (cooling plates and/or current conducting plates) are preferably connected to one another in their edge region by means of an electrically non-conductive connecting means, with plates and connecting means forming a housing. Casting compounds, such as, for example, resins, can be used as connecting means. Hard plastics materials or soft plastics materials can likewise be used. Provision is made for the control connection to furthermore remain accessible.

Ideally, a rectifier for a welding device is realized by means of the converter. In this case, the converter assumes the function of a known resistance welding diode. A welding transformer preferably forms a structural unit with an above-mentioned rectifier. A welding device for resistance welding with a corresponding transformer is thereby easily realizable.

All in all, the disclosure accomplishes a higher power density with greatly reduced heat losses, smaller overall dimensions and a greatly reduced weight as a result of dispensing with heavy and bulky mechanical clamping devices.

It goes without saying that the above-mentioned features and the features still to be explained below can occur not only in the combination described in each case, but also in other combinations not explicitly mentioned here, or be taken alone or in isolation without deviating from the scope of the present disclosure.

The disclosure is illustrated schematically in the following drawings with the aid of exemplary embodiments and is described in detail below with reference to the drawings. In the figures, similar or functionally similar features are provided with the same reference signs unless stated otherwise.

BRIEF DESCRIPTION OF THE DRAWINGS

Exemplary embodiments of the disclosure are presented in the drawings an are explained in more detail in the description below.

In the drawings.

DETAILED DESCRIPTION

Figure 1:
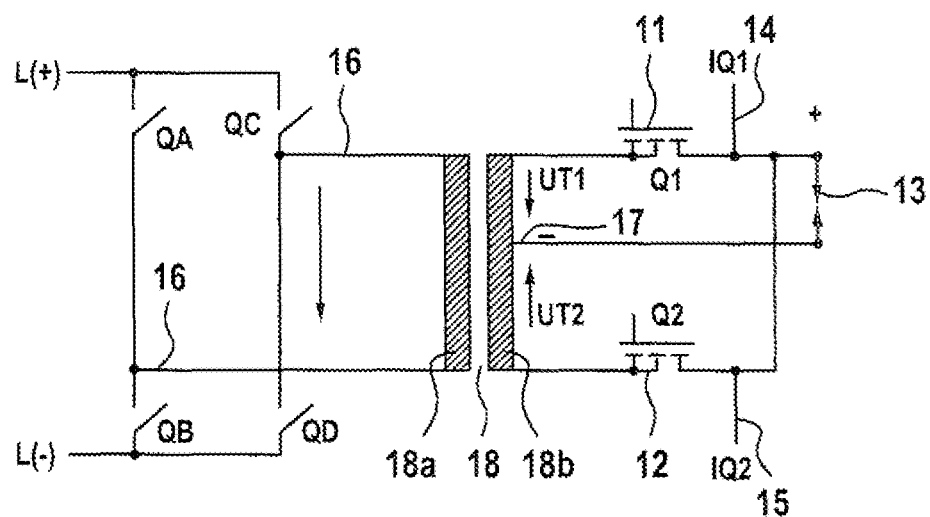
FIG. 1 shows, in broadly schematic form, a center point circuit as a preferred embodiment.

FIG. 1 shows a center point circuit. A full bridge is illustrated on the left in the drawing. This comprises a first and a second bridge arm. A DC (link) voltage L(+) and L(−) is applied in parallel to both bridge arms. Each of the bridge arms comprises two switches QA, QB and QC, QD, for example in the form of IGBTs. The switch pair QA, QB is associated with the first bridge arm and the switch pair QC, QD is associated with the second bridge arm. The primary winding 18a of a welding transformer 18 is arranged in the bridge branch.

The converter according to the disclosure is shown on the right in the drawing. This converter is arranged on two secondary windings 18b of the welding transformer 18. Both secondary windings 18b are connected in series and form a center tap 17 at the contact point of the series connection. A first secondary branch and a second secondary branch are thereby produced. A first welding electrode 13 of a pair of electrical resistance welding tongs is connected to the center tap 17, which resistance welding tongs can have both a positive and a negative potential during the welding procedure. A second welding electrode 13 is connected to the power semiconductors 11 (Q1) and 12 (Q2). The first power semiconductor 11 is arranged in the first secondary branch and the second power semiconductor 12 is arranged in the second secondary branch. A current measuring device 14, 15 for the branch currents IQ1, IQ2 is provided in each of the branches. The components of the circuit arrangement shown in FIG. 1, in particular Q1 and Q2 and preferably also the current measuring devices 14, 15, and the connecting lines between the components are at least partially, and preferably completely, embedded in a component carrier (not shown, see FIG. 2, reference sign 21).

The secondary-side power semiconductors 11, 12 serve to apply a welding current to a workpiece by means of the welding electrodes 13. The power semiconductors 11, 12 are preferably equipped with freewheeling diodes as overvoltage protection (not shown). The freewheeling diodes can also be integrated in the power semiconductors 11, 12.

A magnetic field sensor (not shown) is preferably arranged on the welding transformer 18. The signals of the magnetic field sensor are preferably evaluated by the actuating device (not shown, see FIG. 2, reference sign 26), so that the power semiconductors 11, 12 can also be switched using the evaluation result of the sensor signal. The system performance can be influenced by the magnetic field sensor.

The power semiconductors 11, 12 are preferably arranged symmetrically on the component carrier. This symmetrical design enables a uniform current distribution, which has an advantageous effect on the system performance.

Figure 2:
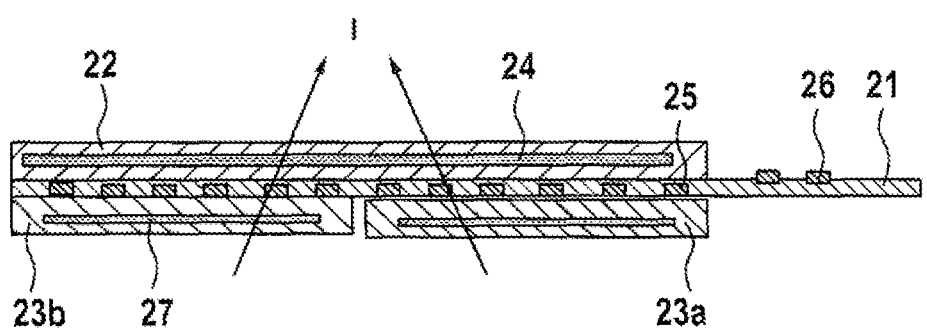
FIG. 2 shows, in broadly schematic form, a first preferred construction.

FIG. 2 shows a first preferred embodiment for the structural implementation of the converter in a sandwich construction. A plurality of power semiconductors 25 are shown, which are embedded in a printed circuit board 21 and which, as shown in FIG. 1 (see reference signs 11 and 12), are interconnected with one another. The power semiconductors 11 and 12 shown in FIG. 1 are realized in the example here by two power semiconductor groups 11 and 12 in each case, with each power semiconductor group 11, 12 comprising a plurality of individual power semiconductors which are operated in parallel with one another and of which there can theoretically be any number, which depends on the current to be provided. The number of power semiconductors 25 used which is illustrated here in the drawing should therefore only be regarded as an example. Each power semiconductor group 11 and 12 preferably comprises n power semiconductors, where n can be a positive whole number excluding zero.

Two copper plates 23a, 23b are provided as electrically conductive current input plates 23a, 23b, and a copper plate 22 is likewise provided as electrically conductive current outlet plate 22, preferably with integrated cooling measures 24, 27 such as, for example, a cooling channel through which a coolant, such as water, can be supplied and discharged during operation. Molybdenum could alternatively also be used as a material for the plates 22, 23a, 23b.

The material thickness of the plates 23a/b, 22 can be, for example, in the millimeter range (e.g. 2 mm). A current connection (e.g. source or drain) of those power semiconductors 25 which represent Q1 of FIG. 1 (e.g. MOSFET) is preferably connected to the current input plate 23a, and a current connection (e.g. drain or source) of those semiconductors 25 which represent Q2 of FIG. 1 is preferably connected to the current input plate 23b. Both copper plates 23a, 23b are preferably aligned in an electrically insulated manner next to one another and parallel to the opposite current output plate 22. Further current connections (e.g. drain or source) of those power semiconductors 25 which represent Q1 and Q2 are preferably connected to one another by means of the single-piece current outlet plate 24. The current input plate 23a and the current input plate 23b are preferably designed to connect the rectifier according to the disclosure to the secondary winding 18b (FIG. 1).

Depending on the desired application, alternative circuit arrangements to this are also conceivable (not shown). Alternatively, the current connection (e.g. drain or source) of those semiconductors 25 which represent Q1 of FIG. 1 (e.g. MOSFET) is connected to a first current output plate (not shown), and the current connection (e.g. drain or source) of those semiconductors 25 which represent Q2 of FIG. 1 is connected to a second current output plate (not shown). Both current output plates (not shown) are then aligned in an insulated manner next to one another and parallel to a single opposite current input plate (not shown). The current connections (e.g. source or drain) of those power semiconductors 25 which represent Q1 and Q2 are connected to one another by means of the single-part current input plate in this alternative solution.

In a further preferred embodiment, both the current input plate and the current output plate are constructed in a plurality of parts and arranged parallel to and opposite one another in order to surround power semiconductors whereof the inputs and/or outputs are not connected to one another circuit-wise and are actuable by means of freely accessible control connections between both plates.

The copper plates 23a,b and 22, which are arranged parallel to and flush with one another in their edge region, are connected to one another at least in their edge region by means of an electrically non-conductive connecting means (not shown), so that the copper plates 23a,b and 22 form a housing together with the connecting means. The connecting means can be a casting compound; however it can alternatively also be realized by a plastics material such as a hard plastics material or a soft plastics material. The connecting means enables the realization of a housing, which also meets an IP rating, depending on the application.

Positively engaging contact means can be provided at the edge of both copper plates 23a,b and 22 for attaching the connecting means, which contact means ensure a firm contact between connecting means and copper plates 23a,b and 22.

The thickness of the printed circuit board 21 can be in the micrometer range, for example 100 micrometers. The control connections of the power semiconductors 25 are likewise comprised by the printed circuit board 21 and can be connected by means of an actuating device 26 for the power semiconductors 11, 12, which actuating device is likewise comprised by the printed circuit board 21 or integrated in the printed circuit board.

As shown in the drawing, the applied current (I, direction of the arrow is relevant) can be controlled by means of the control connections and take a specifiable direction from the current input plates 23a, 23b to the current output plate 22. The waste heat (heat losses) occurring during operation of the arrangement can, at the same time, be dissipated, in particular accelerated, in both directions by means of the current input plates 23a, 23b and the current outlet plate 22 if cooling channels 23, 27 are provided in all plates 22, 23a, 23b or a cooling channel 23, 27 is provided in at least one of the plates 22, 23a, 23b.

Figure 3:
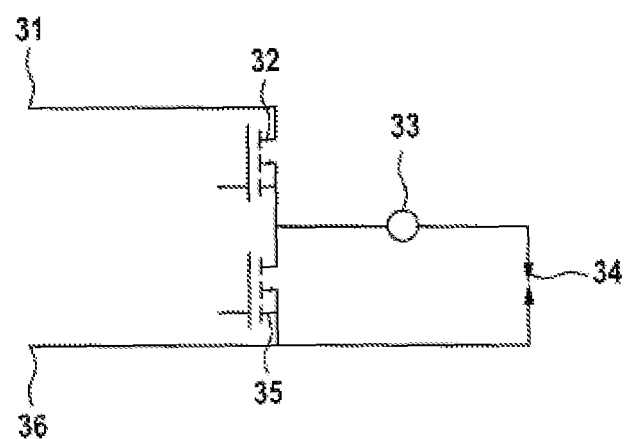
FIG. 3 shows, in broadly schematic form, a half bridge as a preferred circuit.

FIG. 3 shows an embedded half bridge circuit in schematic form. The bridge is between a first 31 and a second 36 potential and is realized by means of two MOSFET switches 32, 35 whereof the control connections (shown open) are actuable by the actuating device 26 (see FIG. 2). A first electrode of a pair of welding tongs 34 is electrically connected between both MOSFET switches 32, 35. A second electrode of the welding tongs is connected in this example to the potential 36. Both potentials 31, 36 are preferably provided by the secondary windings shown in FIG. 1.

LIST OF REFERENCE SIGNS 11,12 Power switches, MOSFETs output-side
13 Load, welding tongs
14, 15 Current measuring circuit
16 Primary-side transformer link
17 Center tap, transformer
18 Transformer
18a Primary winding, transformer
18b Secondary winding, transformer
QA, QB, QC, QD Power switches, MOSFETS input-side
IQ1, IQ2 Welding current
L(+), L(−) DC link direct voltage of the welding inverter
21 Printed circuit board
22 Current input plate, copper plate
23a, 23b Current output plate(s), copper plate(s)
24 Integrated water cooling
25 Embedded semiconductors in the printed circuit board, converter circuit
26 Actuating means for control connections of the power switches
27 Integrated water cooling
I Welding current
31, 36 Voltage supply
32, 35 Control means
33 Measuring means for current
34 Welding tongs

What is claimed is:

1. A converter circuit arrangement for electric current for resistance welding, the converter circuit arrangement comprising:
a first current conducting plate arranged in first plane;
at least one second current conducting plate arranged in a second plane that is substantially parallel to the first plane;
a component carrier made of an electrically insulating material, the component carrier being arranged between the first plane and the second plane such that a first side of the component carrier faces the first current conducting plate and a second side of the component carrier, which is opposite the first side, faces the at least one second current conducting plate, the component carrier being substantially parallel to both the first current conducting plate and the second current conducting plate; and
a converter circuit having a first semiconductor switch and a second semiconductor switch that are at least partially embedded in the component carrier and have separate control connections, the first semiconductor switch and the second semiconductor switch being interconnected with one another so as to realize the converter circuit, the first semiconductor switch and the second semiconductor switch being connected to the first current conducting plate and the second current conducting plate such that one of (i) an input of the converter circuit is formed by the first current conducting plate and an output of the converter circuit is formed by the at least one second current conducting plate, and (ii) the output of the converter circuit is formed by the first current conducting plate and the input of the converter circuit is formed by the at least one second current conducting plate.

2. The converter circuit arrangement according to claim 1, the component carrier comprising:
a plurality of conducting planes, the input of the converter circuit being connected to a first conducting plane of the plurality of conducting planes and the output of the converter circuit being connected to a second conducting plane of the plurality of conducting planes, the second conducting plane being separate from the first conducting plane,
wherein the separate control connections of the first semiconductor switch and the second semiconductor switch are connected to at least one third conducting plane of the plurality of conducting planes that is arranged between the first conducting plane and the second conducting plane such that the separate control connections of the first semiconductor switch and the second semiconductor switch are separately actuable via the at least one third conducting plane.

3. The converter circuit arrangement according to claim 1, further comprising:
control lines comprising conductive paths embedded in the component carrier and connected to the separate control connections of the first semiconductor switch and the second semiconductor switch.

4. The converter circuit arrangement according to claim 1, wherein the input of the converter circuit is connected to a transformer winding and the output of the converter circuit is connected to a load.

5. The converter circuit arrangement according to claim 4, wherein the output of the converter circuit is connected to a center tap of the transformer winding.

6. The converter circuit arrangement according to claim 3, further comprising:
an actuating device connected to the control lines and configured to actuate the first semiconductor switch and the second semiconductor switch via the separate control connections, the actuating device being at least partially embedded in the component carrier.

7. The converter circuit arrangement according to claim 1, further comprising:
load current measuring circuits configured to measure current flowing through of each of the first semiconductor switch and the second semiconductor switch, the load current measuring circuits being at least partially embedded in the component carrier.

8. The converter circuit arrangement according to claim 1, wherein the at least one second current conducting plate comprises:
a first plate of the at least one second current conducting plate arranged in the second plane; and
a second plate of the at least one second current conducting plate arranged in the second plane, the third current conducting plate being electrically isolated from the second current conducting plate,
wherein the first semiconductor switch is connected between the first current conducting plate and the first plate of the at least one second current conducting plate, and
wherein the second semiconductor switch being connected between the first current conducting plate and the second plate of the at least one second current conducting plate.

9. The converter circuit arrangement according to claim 1, wherein the converter circuit is arranged on a transformer having a primary winding and a secondary winding, the secondary winding being connected to the input of the converter circuit of the converter circuit arrangement.

10. A resistance welding device having:
a full bridge circuit attached to a DC link direct voltage;
a converter circuit arrangement having (i) a first current conducting plate arranged in first plane, (ii) at least one second current conducting plate arranged in a second plane that is substantially parallel to the first plane, (iii) a component carrier made of an electrically insulating material, the component carrier being arranged between first plane and the second plane such that a first side of the component carrier faces the first current conducting plate and a second side of the component carrier, which is opposite the first side, faces the second current conducting plate, the component carrier being substantially parallel to the first current conducting plate and the second current conducting plate, and (iv) a converter circuit having a first semiconductor switch and a second semiconductor switch that are at least partially embedded in the component carrier and have separate control connections, the first semiconductor switch and the second semiconductor switch being interconnected with one another so as to realize the converter circuit, the first semiconductor switch and the second semiconductor switch being connected to the first current conducting plate and the second current conducting plate such that one of (i) an input of the converter circuit is formed by the first current conducting plate and an output of the converter circuit is formed by the at least one second current conducting plate, and (ii) the output of the converter circuit is formed by the first current conducting plate and the input of the converter circuit is formed by the at least one second current conducting plate; and
a transformer having a primary winding connected an output of the full bridge and a secondary winding connected to the input of the converter circuit of the converter circuit arrangement,
wherein the converter circuit is arranged on the transformer and the output of the converter circuit is attached to welding electrodes which are held by a pair of welding tongs.

11. The converter circuit arrangement according to claim 1, wherein the first semiconductor switch and the second semiconductor switch are each completely embedded in the component carrier.

12. The converter circuit arrangement according to claim 3, wherein the control lines are arranged symmetrically to one another.

13. The converter circuit arrangement according to claim 6, wherein the actuating device is completely embedded in the component carrier.

14. The converter circuit arrangement according to claim 7, wherein the load current measuring circuits are completely embedded in the component carrier.

15. The converter circuit arrangement according to claim 8, wherein the output of the converter circuit is formed by the first current conducting plate and the input of the converter circuit is formed by a combination of the first plate and the second plate of the at least one second current conducting plate.

16. The converter circuit arrangement according to claim 8, wherein the input of the converter circuit is formed by the first current conducting plate and the output of the converter circuit is formed by a combination of the first plate and the second plate of the at least one second current conducting plate.

17. A converter circuit arrangement for electric current for resistance welding, the converter circuit arrangement comprising:
a first current conducting plate arranged in first plane;
a second current conducting plate arranged in a second plane that is substantially parallel to the first plane;
a third current conducting plate arranged in the second plane, the third current conducting plate being electrically isolated from the second current conducting plate;
a component carrier made of an electrically insulating material, the component carrier being arranged between the first plane and the second plane such that a first side of the component carrier faces the first current conducting plate and a second side of the component carrier, which is opposite the first side, faces the second current conducting plate and the second current conducting plate, the component carrier being substantially parallel to the first current conducting plate, the second current conducting plate, and the third current conducting plate; and a converter circuit having a first semiconductor switch and a second semiconductor switch that are at least partially embedded in the component carrier and have separate control connections, the first semiconductor switch being connected between the first current conducting plate and the second current conducting plate, the second semiconductor switch being connected between the first current conducting plate and the third current conducting plate, wherein one of (i) an input of the converter circuit is formed by the first current conducting plate and an output of the converter circuit is formed by a combination of the second current conducting plate and the third current conducting plate, and (ii) the output of the converter circuit is formed by the first current conducting plate and the input of the converter circuit is formed by the combination of the second current conducting plate and the third current conducting plate.

* * * * *